United States Patent [19]

Kawashima et al.

[11] Patent Number: 5,589,712
[45] Date of Patent: Dec. 31, 1996

[54] SEMICONDUCTOR INTEGRATED CIRCUIT DEVICE AND A METHOD OF MANUFACTURING THE SAME

[75] Inventors: Ikue Kawashima, Kohbe; Katsunari Hanaoka, Ono, both of Japan

[73] Assignee: Ricoh Company, Ltd., Tokyo, Japan

[21] Appl. No.: 349,033

[22] Filed: Dec. 2, 1994

[30] Foreign Application Priority Data

Dec. 3, 1993 [JP] Japan ................ 5-339563
Aug. 26, 1994 [JP] Japan ................ 6-225763

[51] Int. Cl.$^6$ ............... H01L 23/48; H01L 21/44
[52] U.S. Cl. ............... 257/750; 257/749; 257/763; 257/764; 257/770; 257/771; 257/915; 257/924; 437/180; 437/189; 437/192; 437/196
[58] Field of Search ............... 257/763, 764, 257/770, 771, 915, 924, 750, 749; 437/180, 189, 192, 196

[56] References Cited

U.S. PATENT DOCUMENTS 4,875,088 10/1989 Egawa et al. .................. 257/915
5,049,975 9/1991 Ajika et al. .................. 257/915
5,345,108 9/1994 Kikkawa .................. 257/915

Primary Examiner—Edward Wojciechowicz
Attorney, Agent, or Firm—Cooper & Dunham LLP

[57] ABSTRACT

A semiconductor integrated circuit device includes a substrate formed with semiconductor elements and a metal wiring having a laminated structure and provided on the substrate. The metal wiring includes a first layer including aluminum as a main component, and a second layer formed on the first layer. The second layer includes titanium and nitrogen as main components. The second layer includes more titanium than nitrogen in number of atoms. A third layer may be formed between the first and second layers. The third layer includes a compound of aluminum and titanium as a main component. A fourth layer may further be formed between the second and third layers. The fourth layer includes titanium as a main component and is free of aluminum.

14 Claims, 4 Drawing Sheets

F I G. 5
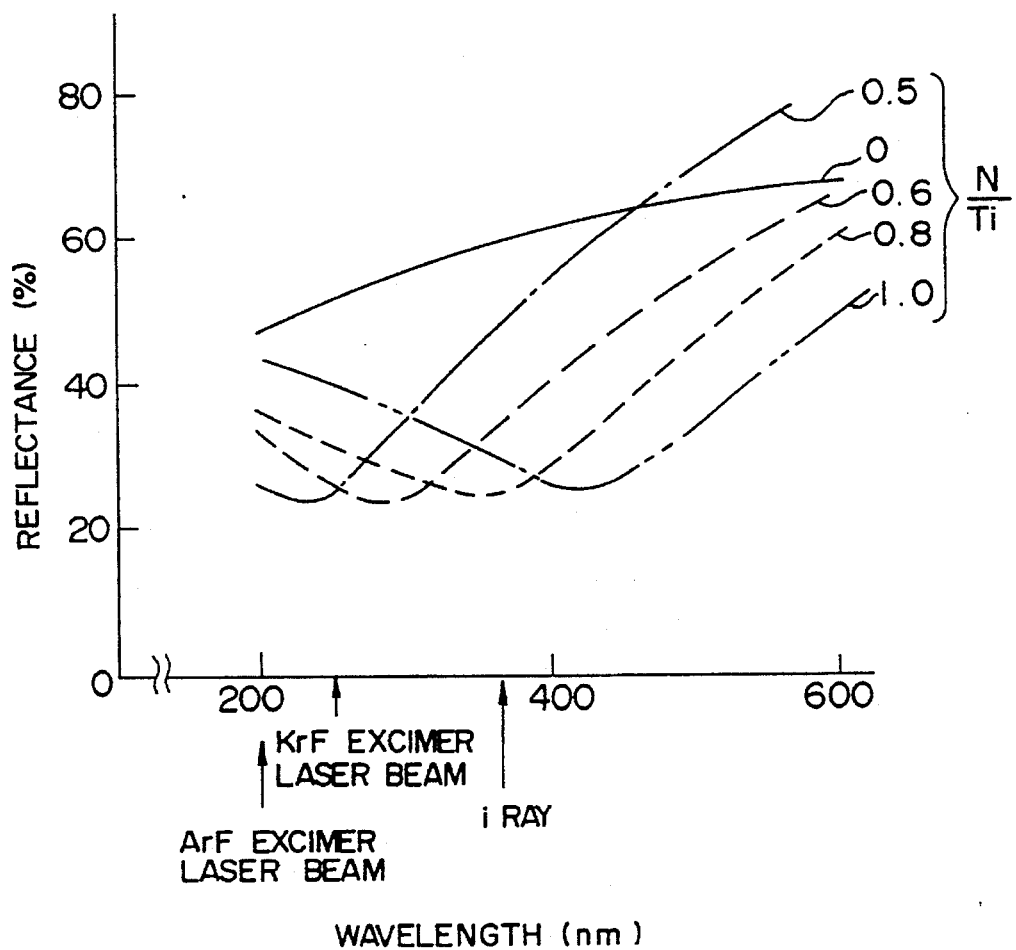

SEMICONDUCTOR INTEGRATED CIRCUIT DEVICE AND A METHOD OF MANUFACTURING THE SAME

BACKGROUND OF THE INVENTION

1. Field of the Invention

The present invention relates to a semiconductor integrated circuit device, and also relates to a method of manufacturing the same.

2. Description of the Related Art

In general, metal wiring in a semiconductor integrated circuit device is made of aluminum (Al) or an aluminum alloy containing a small amount of silicon (Si) or copper (Cu).

For forming the Al or Al alloy wiring, an Al or Al alloy film is superposed on a substrate which is formed with semiconductor circuit elements. Subsequently, a photoresist film is coated on the Al or Al alloy film and then formed with a wiring pattern by photolithography. The Al or Al alloy wiring is formed by etching the Al or Al alloy film using the wiring pattern as a mask.

In the course of photolithography, when reflectance of the Al or Al alloy film is high relative to light which is used for exposure of the photoresist film superposed on the Al or Al alloy film, a problem is raised that the exposure can not provide a fine wiring pattern on the photoresist film due to halation.

For antihalation, it has been available to superpose on the Al or Al alloy film a TiN film having a lower reflectance to the exposure light as compared with the Al or Al alloy film (see "Proceeding 10th, VMIC(1993), page 248, FIG. 1(d)"). For this purpose, the TiN film, which is formed by normal reactive DC sputtering and has a stoichiometric composition where Ti (titanium) and N (nitrogen) are in the ratio 1:1 in number of atoms, has been used (see "Thin Solid Films, 97(1982), page 73, FIGS. 5 and 6").

Hereinafter, "ratio" will be defined as the "ratio in number of atoms" throughout the specification.

Although the TiN film made of Ti and N in the ratio 1:1 has a lower reflectance than the Al or Al alloy film, a film made of a metal material having an even lower reflectance makes it possible to provide a further finer wiring pattern on the photoresist film.

Further, although the sputtering is normally used to form the TiN film, a film forming speed is low for the TiN film having the ratio 1:1 (see "Thin Solid Films, 153(1987), page 292, FIG. 2(a)"). This leads to reduction in throughput, and thus is disadvantageous in view of mass productivity.

SUMMARY OF THE INVENTION

Therefore, it is an object of the present invention to make possible finer patterning of a metal wiring, using a wiring material in photolithography which has a lower reflectance relative to exposure light.

It is another object of the present invention to provide a wiring material which has a higher film forming speed than a compound of Ti and N in the ratio 1:1 and which is excellent in mass productivity and has a lower reflectance.

It is another object of the present invention to provide a wiring structure which is excellent in anti-electromigration and in mass productivity and has a low reflectance to exposure light.

It is another object of the present invention to provide a method of producing such a wiring structure.

According to one aspect of the present invention, a semiconductor device comprises a substrate formed with semiconductor elements; and a metal wiring having a laminated structure and provided on the substrate, the metal wiring including a first layer including aluminum as a main component; and a second layer formed on the first layer, the second layer including, as main components, titanium and nitrogen in a given ratio with an amount of titanium greater than that of nitrogen in number of atoms.

According to another aspect of the present invention, a semiconductor device comprises a substrate formed with semiconductor elements; and a metal wiring having a laminated structure and provided on the substrate, the metal wiring including a first layer including aluminum as a main component; a second layer formed on the first layer and including a compound of aluminum and titanium as a main component; and a third layer formed on the second layer, the third layer including, as main components, titanium and nitrogen in a given ratio with an amount of titanium greater than that of nitrogen in number of atoms.

According to another aspect of the present invention, a semiconductor device comprises a substrate formed with semiconductor elements; and a metal wiring having a laminated structure and provided on the substrate, the metal wiring including a first layer including aluminum as a main component; a second layer formed on the first layer and including a compound of aluminum and titanium as a main component; a third layer formed on the second layer and including titanium as a main component, the third layer including no aluminum; and a fourth layer formed on the third layer, the fourth layer including, as main components, titanium and nitrogen in a given ratio with an amount of titanium greater than that of nitrogen in number of atoms.

According to another aspect of the present invention, the foregoing ratios each may be $0.5 \leq N/Ti < 1$, where N represents nitrogen and Ti represents titanium.

According to another aspect of the present invention, a method of manufacturing a semiconductor device including a substrate formed with semiconductor elements and a metal wiring provided on the substrate comprises the steps of forming on the substrate a first film including aluminum as a main component; forming on the first film a second film including titanium and nitrogen as main components, the second film formed by sputtering using a target made of titanium and mixed sputtering gas of argon and nitrogen; and forming the laminated first and second films into a given pattern of wiring to provide the metal wiring.

According to another aspect of the present invention, the second film may have a ratio of titanium and nitrogen defined by $0.5 \leq N/Ti < 1$, where N represents nitrogen and Ti represents titanium.

According to another aspect of the present invention, a method of manufacturing a semiconductor device including a substrate formed with semiconductor elements and a metal wiring provided on the substrate comprises the steps of superposing on the substrate a first film including aluminum as a main component; superposing titanium as a second film on the first film by sputtering using a target made of titanium and sputtering gas of argon; superposing on the second film a third film including titanium and nitrogen as main components, by adding nitrogen gas to the argon sputtering gas to form mixed sputtering gas; and forming the laminated first to third films into a given pattern of wiring to provide the metal wiring.

According to another aspect of the present invention, the third film may have a ratio of titanium and nitrogen defined by $0.5 \leq N/Ti < 1$, where N represents nitrogen and Ti represents titanium.

BRIEF DESCRIPTION OF THE DRAWINGS

The present invention can be understood more fully from the detailed description given hereinbelow and from the accompanying drawings of the preferred embodiments of the invention, which are given by way of example only, and are not intended to limit the present invention.

In the drawings:

FIG. 5 is a characteristic diagram showing reflectance of Ti and TiN films having various ratios N/Ti in number of atoms relative to wavelengths of exposure light.

DESCRIPTION OF THE PREFERRED EMBODIMENT

Now, preferred embodiments of the present invention will be described hereinbelow with reference to the accompanying drawings.

Figure 1:
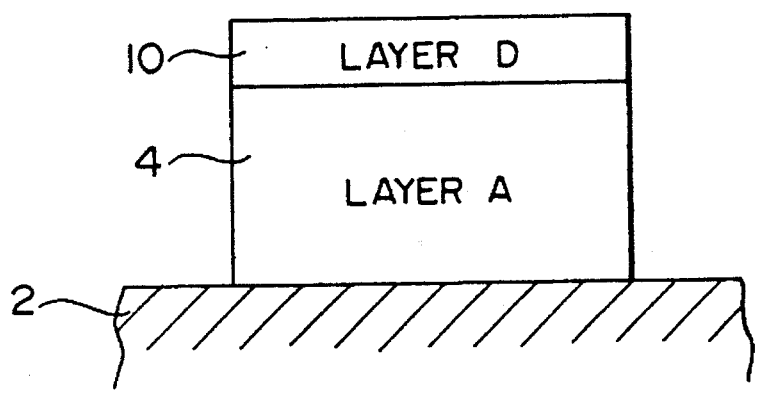
FIG. 1 is a schematic sectional view showing a laminated or multilayer structure of a semiconductor integrated circuit device according to a first preferred embodiment of the present invention.
Figure 2:
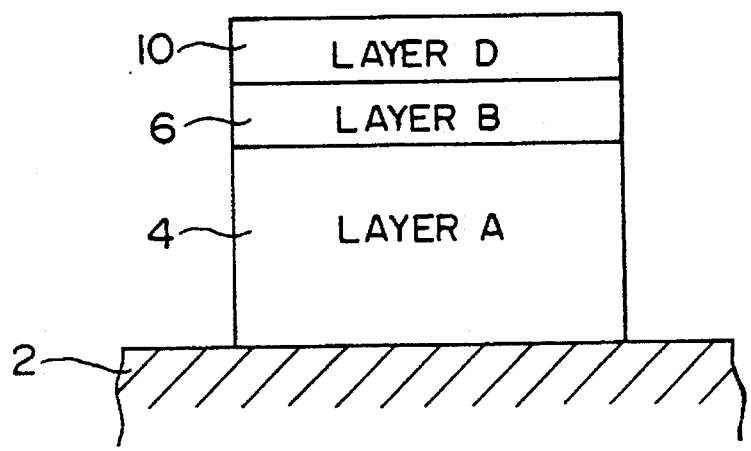
FIG. 2 is a schematic sectional view showing a laminated or multilayer structure of a semiconductor integrated circuit device according to a second preferred embodiment of the present invention.
Figure 3:
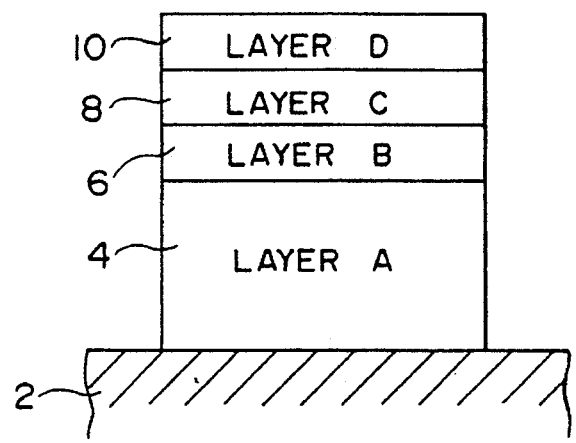
FIG. 3 is a schematic sectional view showing a laminated or multilayer structure of a semiconductor integrated circuit device according to a third preferred embodiment of the present invention.

FIGS. 1, 2 and 3 schematically show laminated or multilayer structures of semiconductor devices according to first, second and third preferred embodiments of the present invention.

In these figures, numeral 4 denotes a layer A which is a wiring material film including Al as a main component. The layer A may be made of an alloy of Al—Cu, Al—Si—Cu, Al—Si or the like and has a thickness of 1,000 angstroms to 20,000 angstroms. Numeral 6 denotes a layer B which is a wiring material film including a compound of Al and Ti as a main component and has a thickness of 5 angstroms to 2,000 angstroms. Numeral 8 denotes a layer C which is a wiring material film including Ti as a main component without any Al. For example, the layer C may be a Ti film or a TiN film including a small amount of N, and has a thickness of 100 angstroms to 2,000 angstroms. Numeral 10 denotes a layer D which is a wiring material film including Ti and N as main components. A ratio of Ti and N in number of atoms is $0 < N/Ti < 1$, and preferably $0.5 \leq N/Ti < 1$. The layer D has a thickness of 20 angstroms to 2,000 angstroms.

Figure 4:
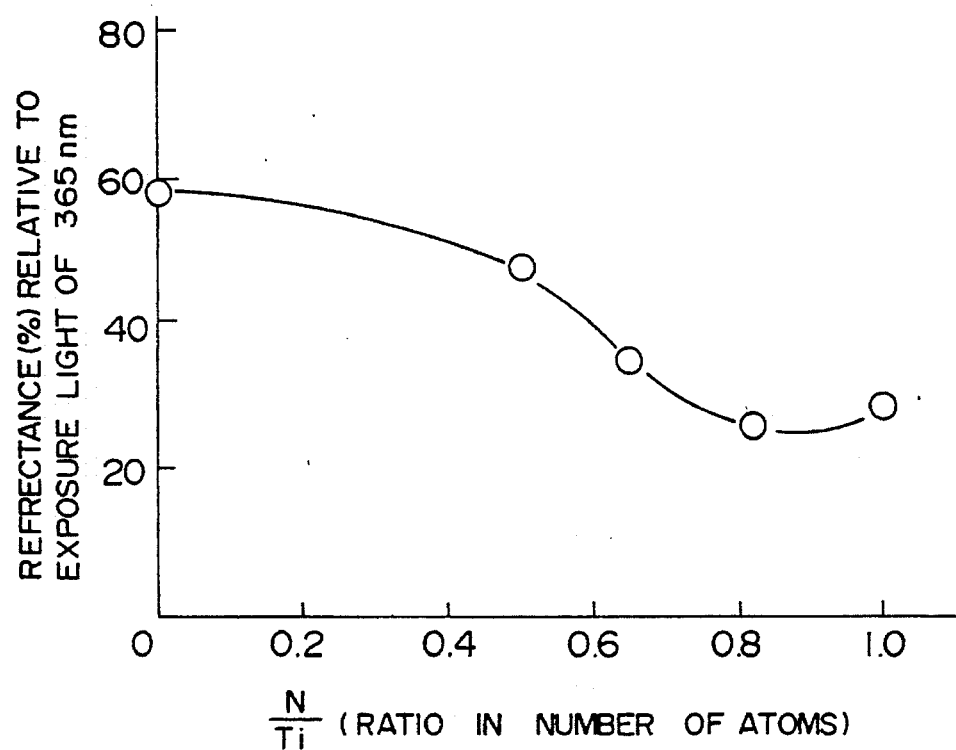
FIG. 4 is a characteristic diagram showing reflectance of Ti and TiN films relative to exposure light of 365 nm, in terms of ratios N/Ti in number of atoms.

It has been found out that there exists a range of compositions where a ratio N/Ti is less than 1 (one) and where reflectance of a TiN film relative to the i ray (wavelength $\lambda = 365$ nm) currently used in photolithography is lower than that at N/Ti=1. FIG. 4 shows reflectance of Ti and TiN films relative to the i ray, in terms of ratios N/Ti in number of atoms. FIG. 5 shows how the reflectance of Ti and TiN films having various ratios N/Ti varies depending on the wavelengths of exposure light from a light source used in photolithography. As appreciated from FIG. 5, as the ratio N/Ti becomes smaller, the wavelength which provides the smallest reflectance becomes shorter. With regard to wavelengths of the KrF excimer laser beam and the ArF excimer laser beam which are expected to be future light sources for photolithography, a TiN film of a ratio N/Ti=0.5 provides the smallest reflectance. From the results shown in FIGS. 4 and 5, it is preferable that $0.5 \leq N/Ti < 1$.

When forming the Ti film or the TiN film by sputtering, a target formed of Ti is used. Further, when forming the Ti film, pure Ar (argon) gas is used as the sputtering gas. On the other hand, when forming the TiN film, a mixture of Ar gas and $N_2$ gas is used as the sputtering gas. However, since Ti and $N_2$ are liable to react with each other, when an amount of $N_2$ gas is large, a surface of the target is nitrided to a large extent so as to reduce the sputtering rate of TiN.

Figure 6:
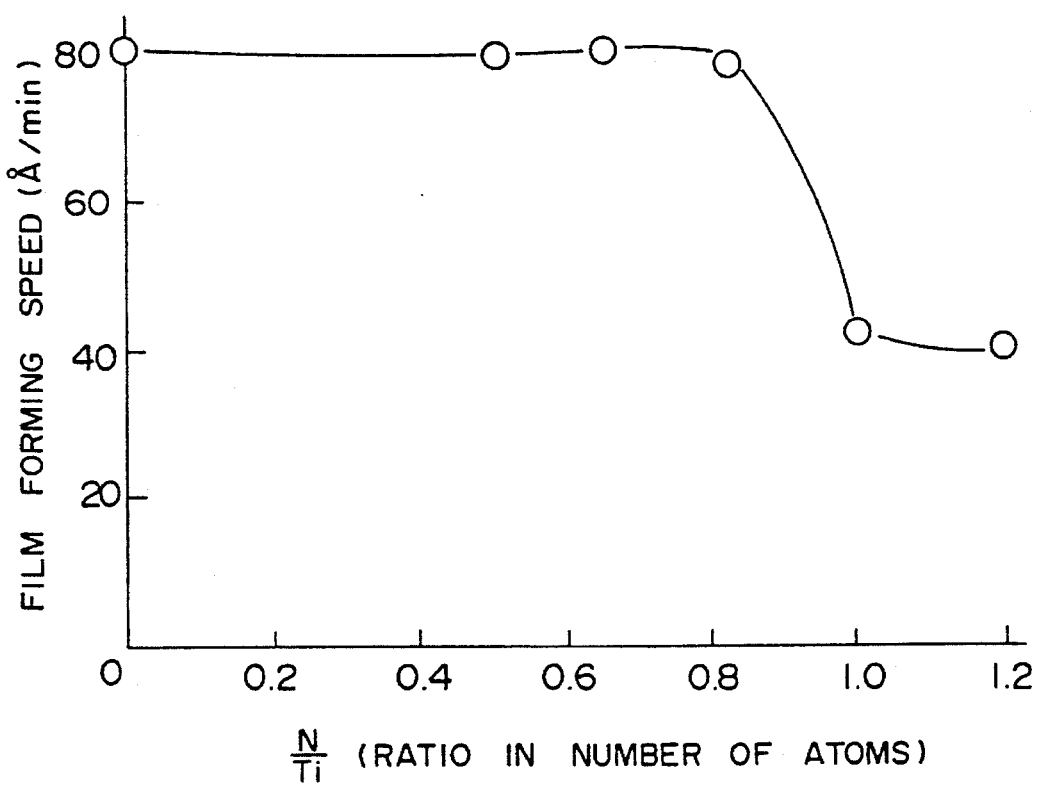
FIG. 6 is a characteristic diagram showing film forming speeds of Ti and TiN films relative to ratios N/Ti in number of atoms.

FIG. 6 shows film forming speeds of the sputtering using the Ti target, relative to ratios N/Ti. As seen in FIG. 6, the film forming speed is low (around a ratio N/Ti=1. On the other hand, when a ratio N/Ti becomes lower than 1, substances on the surface of the target are forced out by the sputtering predominantly as compared with the nitriding on the surface of the target due to $N_2$ gas. As a result, Ti is constantly exposed on the surface of the target so that, as appreciated from FIG. 6, the film forming speed is high in a region where a ratio N/Ti is small.

When a Ti film is superposed on an Al film, a compound of Al and Ti is formed on the Al—Ti interface by a subsequent heat treatment so that anti-electromigration of Al is improved. In a semiconductor device manufacturing method according to a preferred embodiment of the present invention, when a pure Ti film is superposed on an Al or Al alloy film to form a layer of an AlTi compound, pure Ar gas is first used as the sputtering gas to form the pure Ti film. Subsequently, in the course of sputtering, pure Ar gas is switched to a mixture of Ar gas and $N_2$ gas so that a laminated structure shown in FIG. 2 or 3 is obtained.

On the other hand, when forming a TiN film of a ratio $N/Ti \geq 1$, TiN is formed on the surface of the Ti target. Accordingly, for forming the pure Ti film on the Al or Al alloy film, it is necessary to perform in advance the sputtering cleaning of the Ti target using Ar gas to form Ti on the surface of the target. As a result, the foregoing continuous film forming, which can be performed according to the preferred embodiment of the present invention by switching sputtering gas from the pure Ar gas to a the mixture of Ar gas and $N_2$ gas, can not be performed. This leads to a reduction in throughput and thus in mass productivity.

In FIGS. 1 to 3, numeral 2 denotes a substrate in the form of a silicon wafer formed with semiconductor circuit elements. The substrate 2 is coated with a thermal oxide film and formed with contact holes, or coated with a layer insulation film and formed with through holes when used for a metal wiring of a second or further layer. In case of the Al or Al alloy wiring, it is known to provide a W (tungsten) film, a TiN film or a Ti film under the Al or Al alloy wiring for the purpose of enhancing anti-electromigration. Accordingly, in the preferred embodiment of the present invention, the substrate 2 may be formed on its surface with the W film, the TiN film, the Ti film or the like so as to enhance anti-electromigration.

In the preferred embodiment of the present invention, the semiconductor device manufacturing method includes the following steps (A) to (D) so as to form a metal wiring on the substrate. Specifically, step (A) superposes on the substrate a first film including Al as a main component; step (B) superposes Ti as a second film on the first film by sputtering where Ti is used as a target and Ar is used as sputtering gas; step (C) superposes on the second film a third film including Ti and N as main components, by switching the Ar sputtering gas to a mixed gas of Ar and N in the same sputtering apparatus used at step (B); and step (D) forms the laminated films into a given pattern of the wiring.

As appreciated, according to the foregoing semiconductor device manufacturing method, the film of the Al—Ti alloy is formed on the first film including Al as a main component for improving anti-electromigration of a wiring, and the TiN film of a ratio N/Ti<1 is formed on the film of the Al—Ti alloy. On the other hand, as described above, since anti-electromigration can also be improved by providing a W film, a TiN film or a Ti film under the first film including Al as a main component, it is possible that no problem is raised for anti-electromigration even without providing the Al—Ti alloy film on the first film including Al as a main component. Accordingly, the present invention also includes the structure of the first preferred embodiment as shown in FIG. 1, wherein a TiN film of a ratio N/Ti<1 is directly superposed on the first film including Al as a main component. In this case, the semiconductor device manufacturing method includes the following steps (A) to (C) so as to form a metal wiring on the substrate. Specifically, step (A) superposes on the substrate a first film including Al as a main component; step (B) superposes on the first film a second film including Ti and N as main components by sputtering where Ti is used as a target and mixed gas of Ar and N is used as sputtering gas; and step (C) superposes to form the laminated films into a given pattern of the wiring.

EXAMPLES

The results of some experiments will be described hereinbelow.

Example 1

Example 1 relates to the method of manufacturing the structure shown in FIG. 2.

A 6-inch silicon wafer was used as the substrate. After forming semiconductor circuit elements, a thermal oxide film was formed on the silicon wafer by heat treatment for 30 minutes at 900° C. in the oxygen atmosphere under the atmospheric pressure. Subsequently, an Al—Si—Cu film (Al=98.5%, Si=1%, Cu=0.5% in number of atoms) with a thickness of 6,000 angstroms was formed on the thermal oxide film by sputtering with the pressure of the Ar sputtering gas set at 5 mTorr, DC power of 20 W/cm$^2$ and temperature of the substrate at 150° C.

Thereafter, a Ti film with a thickness of 50 angstroms was superposed on the Al—Si—Cu film by sputtering with the pressure of the Ar sputtering gas set at 3 mTorr, DC power of 2 W/cm$^2$ and temperature of the substrate at 100° C.

Thereafter, a TiN film was superposed by adding N$_2$ gas to Ar sputtering gas and continuing the Ti sputtering. At this time, a partial pressure of Ar gas was fixed to 3 mTorr, and a partial pressure of newly added N$_2$ gas was changed to five values, that is, 0 mTorr, 0.3 mTorr, 0.6 mTorr, 1 mTorr and 3 mTorr. A thickness of the TiN film was 1,000 angstroms in the respective partial pressures.

The obtained samples of the laminated structure were assigned numbers No. 1 to No. 5 in the order of N$_2$ gas partial pressure from low to high. Specifically, No. 1 was assigned to the sample with the lowest N$_2$ gas partial pressure, and numbers were assigned to the remaining samples in turn. A result of measurement of reflectance of these samples relative to the i-ray ($\lambda$=365 nm) is shown in Table 1.

TABLE 1

| Sample No. | Reflectance (%) |
| --- | --- |
| 1 | 60 |
| 2 | 46 |
| 3 | 25 |
| 4 | 26 |
| 5 | 28 |

In normal photolithography, the problem of halation is not so substantial when reflectance is no more than 50%.

Table 2 shows the measured ratios (in number of atoms) of Ti and N of the TiN films of the samples No. 1 to No. 5, using the Rutherford backscattering.

TABLE 2

| Sample No. | Ratio N/Ti |
| --- | --- |
| 1 | 0 |
| 2 | 0.58 |
| 3 | 0.81 |
| 4 | 0.92 |
| 5 | 1.00 |

Table 3 shows a measured of film forming speeds of the TiN films of the samples No. 1 to No. 5. As appreciated from Table 3, only the film forming speed of the sample No. 5 was low as compared with those of the other samples. It is considered that a surface of the Ti target was nitrided to a large extent to form a TiN surface.

TABLE 3

| Sample No. | Film Forming Speed (angstrom/min) |
| --- | --- |
| 1 | 82 |
| 2 | 78 |
| 3 | 83 |
| 4 | 79 |
| 5 | 38 |

Thereafter, the obtained samples of the laminated structure having the TiN/Ti/Al—Si—Cu films were formed into a given pattern with a width of 10 μm and a length of 10 mm. Subsequently, a plasma SiN film was formed thereon under a film forming condition with SiH$_4$ gas of 10 sccm, N$_2$ gas of 100 sccm, temperature of the substrate at 300° C., total gas pressure at 1 Torr and RF power of 2 W/cm$^2$. A thickness of the SiN film was 1 μm.

Thereafter, the samples coated with the SiN film were annealed for 30 minutes at 420° C. in the N$_2$ atmosphere under the atmospheric pressure. Subsequently, allowable current for the i ray was measured under conditions with current density of 1×10$^6$ A/cm$^2$ and temperature at 200° C. Table 4 shows a result of measurement time required until disconnection of the samples. It can be determined to be good when a time until disconnection is no less than 100 hours.

TABLE 4

| Sample No. | Time to Disconnection (hour) |
| --- | --- |
| 1 | 620 |
| 2 | 580 |

TABLE 4-continued

| Sample No. | Time to Disconnection (hour) |
|---|---|
| 3 | 500 |
| 4 | 430 |
| 5 | 370 |
| 6 | 680 |
| Comparative Example | 80 |

Example 2

A sample in Example 2 was prepared in the following manner and assigned No. 6:

A thickness of a Ti film was set to 500 angstroms while it was 50 angstroms in Example 1. A TiN film was formed in the same manner as the sample No. 2 in Example 1. The other conditions are the same as those in Example 1.

The measured of allowable current for the sample No. 6 is also shown in Table 4.

By performing the ESCA analysis to the samples No. 1 to No. 6, it has been confirmed that a Al—Ti alloy layer was formed between the Al—Si—Cu film and the Ti film. This is considered to improve anti-electromigration of the metal wiring. In the sample No. 2, the Ti film was all formed into the Al—Ti alloy. On the other hand, in the sample No. 6, since the Ti film was thick, a lower part of the Ti film was formed into the Al—Ti alloy, while an upper part of the Ti film remained as the Ti film.

Comparative Example

A sample was prepared in the same manner as the sample No. 5 except for formation of the Ti film, which was not formed. The measured allowable current for the sample is also shown in Table 4. It is seen from Table 4 that anti-electromigration became significantly low due to the non-provision of the Ti film.

As appreciated, samples No. 1 to No. 4 and No. 6 correspond only to the preferred embodiment of the present invention, while sample 5 also corresponds to the Comparative Example.

In the foregoing preferred embodiments, the film including Ti and N as main components and including more Ti than N in number of atoms, is formed at the uppermost layer of the metal wiring. This leads to a lower reflectance of TiN film to the exposure light used in photolithography as compared with the conventional TiN film of the ratio N/Ti=1. This further makes it possible to form a finer pattern of wiring.

Further, the TiN film in the foregoing preferred embodiments is formed quicker than the conventional TiN film and thus is advantageous in view of mass productivity.

Moreover, since the Al—Ti compound layer is provided between the Al or Al alloy layer and the TiN layer, anti-electromigration of Al is improved.

It is understood that this invention is not to be limited to the preferred embodiments and modifications described above, and that various changes and modifications may be made without departing from the spirit and scope of the invention as defined in the appended claims.

What is claimed is:

1. A semiconductor device comprising:
   a substrate formed with semiconductor elements; and
   a metal wiring having a laminated structure and provided on said substrate, said metal wiring including:
      a first layer A having aluminum as a main component; and
      a second layer D formed on said first layer A, said second layer D having as main components titanium and nitrogen in a given ratio such that a reflectance of said second layer D is 30% or less for a given wavelength of exposing light in a range including wavelengths different from that of i-light.

2. The semiconductor device as set forth in claim 1, wherein said ratio is $0.5 \leq N/Ti < 1$, where N represents nitrogen and Ti represents titanium.

3. A semiconductor device comprising:
   a substrate formed with semiconductor elements; and
   a metal wiring having a laminated structure and provided on said substrate, said metal wiring including:
      a first layer A having aluminum as a main component;
      a second layer B formed on said first layer A and having a compound of aluminum and titanium as a main component; and
      a third layer D formed on said second layer B, said third layer D having as main components titanium and nitrogen in a given ratio such that a reflectance of said third layer D is 30% or less for a given wavelength of exposing light in a range including wavelengths different from that of i-light.

4. The semiconductor device as set forth in claim 3, wherein said ratio is $0.5 \leq N/Ti < 1$, where N represents nitrogen and Ti represents titanium.

5. A semiconductor device comprising:
   a substrate formed with semiconductor elements; and
   a metal wiring having a laminated structure and provided on said substrate, said metal wiring including:
      a first layer A having aluminum as a main component;
      a second layer B formed on said first layer A and having a compound of aluminum and titanium as a main component;
      a third layer C formed on said second layer B and having titanium as a main component, said third layer C including no aluminum; and
      a fourth layer D formed on said third layer C, said fourth layer D having as main components titanium and nitrogen in a given ratio such that a reflectance of said fourth layer D is 30% or less for a given wavelength of exposing light in a range including wavelengths different from that of i-light.

6. The semiconductor device as set forth in claim 5, wherein said ratio is $0.5 \leq N/Ti < 1$, where N represents nitrogen and Ti represents titanium.

7. A method of manufacturing a semiconductor device including a substrate formed with semiconductor elements and a metal wiring provided on said substrate, said method comprising steps of:
   forming on said substrate a first film A having aluminum as a main component;
   forming on said first film A a second film D having titanium and nitrogen as main components, said second film D formed by sputtering a target made of titanium and using a mixed sputtering gas of argon and nitrogen such that a reflectance of said second film D is 30% or less for a given wavelength of exposing light in a range including wavelengths different from that of i-light; and
   forming said first and second films having a laminated structure into a given pattern of wiring to provide said metal wiring.

8. The method as set forth in claim 7, wherein said second film has a ratio of titanium and nitrogen defined by $0.5 \leq N/Ti < 1$, where N represents nitrogen and Ti represents titanium.

9. A method of manufacturing a semiconductor device including a substrate formed with semiconductor elements and a metal wiring provided on said substrate, said method comprising steps of:

superposing on said substrate a first film A having aluminum as a main component;

superposing titanium as a second film B on said first film A by sputtering A target made of titanium and using a sputtering gas of argon;

superposing on said second film B a third film D having titanium and nitrogen as main components by adding nitrogen gas to said argon sputtering gas to form a mixed sputtering gas such that a reflectance of said third film D is 30% or less for a given wavelength of exposing light in a range including wavelengths different from that of i-light; and forming said first, second, and third films having a laminated structure into a given pattern of wiring to provide said metal wiring.

10. The method as set forth in claim 9, wherein said third film has a ratio of titanium and nitrogen defined by $0.5 \leq N/Ti < 1$, where N represents nitrogen and Ti represents titanium.

11. A semiconductor device comprising:

a substrate formed with semiconductor elements; and a metal wiring having a laminated structure and provided on said substrate, said metal wiring including:

a first layer A having aluminum as a main component; and a second layer D formed on said first layer A, said second layer D having as main components titanium and nitrogen in a ratio of atoms N/Ti which is less than 0.8.

12. A semiconductor device as in claim 11 in which said ratio or atoms N/Ti is 0.6 or less.

13. A method of manufacturing a semiconductor device including a substrate formed with semiconductor elements and a metal wiring provided on said substrate, said method comprising steps of:

forming on said substrate a first film A having aluminum as a main component;

forming on said first film A a second film D having titanium and nitrogen as main components, in a ratio of atoms N/Ti which is less than 0.8, said second film D formed by sputtering a target made of titanium and using a mixed sputtering gas of argon and nitrogen; and forming said first and second films having a laminated structure into a given pattern of wiring to provide said metal wiring.

14. A method of manufacturing a semiconductor device as in claim 13 in which said ratio of atoms N/Ti is 0.6 or less.

* * * * *